United States Patent
Hatipoglu et al.

(10) Patent No.: US 12,114,127 B2
(45) Date of Patent: Oct. 8, 2024

(54) DYNAMIC VALVE FOR AN ELECTRONIC DEVICE

(71) Applicant: Apple Inc., Cupertino, CA (US)

(72) Inventors: Gokhan Hatipoglu, Santa Clara, CA (US); Peter C. Hrudey, San Mateo, CA (US); Scott C. Grinker, Belmont, CA (US); Ankur Jain, Los Gatos, CA (US); Patrick B. Wright, Dartmouth (CA)

(73) Assignee: Apple Inc., Cupertino, CA (US)

( * ) Notice: Subject to any disclaimer, the term of this patent is extended or adjusted under 35 U.S.C. 154(b) by 56 days.

(21) Appl. No.: 17/482,818

(22) Filed: Sep. 23, 2021

(65) Prior Publication Data

US 2023/0093626 A1    Mar. 23, 2023

Related U.S. Application Data

(60) Provisional application No. 63/245,570, filed on Sep. 17, 2021.

(51) Int. Cl.
| | |
|---|---|
| *H04R 1/28* | (2006.01) |
| *F16K 15/16* | (2006.01) |
| *H04R 1/02* | (2006.01) |
| *H04R 3/00* | (2006.01) |
| *H10N 30/00* | (2023.01) |

(52) U.S. Cl.
CPC ........... *H04R 1/2826* (2013.01); *F16K 15/16* (2013.01); *H04R 1/025* (2013.01); *H04R 3/00* (2013.01); *H10N 30/00* (2023.02)

(58) Field of Classification Search
CPC .... H04R 1/2826; H04R 1/025; H04R 1/2823; H04R 1/2846; H04R 3/00; H04R 2499/11; H04R 2499/15; F16K 15/16; H01L 41/08
USPC ................................ 381/332, 333, 334, 388
See application file for complete search history.

(56) References Cited

U.S. PATENT DOCUMENTS

| | | |
|---|---|---|
| 9,107,003 B2 | 8/2015 | Dix et al. |
| 9,706,290 B2 | 7/2017 | Grinker |
| 9,774,941 B2 | 9/2017 | Grinker |

(Continued)

FOREIGN PATENT DOCUMENTS

| | | | | |
|---|---|---|---|---|
| JP | 2006304021 A | * 11/2006 | ............. | H04R 17/00 |
| WO | 98/51122 | 11/1998 | | |

OTHER PUBLICATIONS

Li, Mary, et al., "Fabrication of microshutter arrays for space application," Proceedings of SPIE—The International Society for Optical Engineering, vol. 4407, Apr. 2001, 10 pages.

Jutzi, Fabio, et al., "Low Voltage Electrostatic 90° Turning Flap for Reflective MEMS Display," 2010 International Conference on Optical MEMES & Nanophotonics, 2010, 2 pages.

Jhabvala, M.D., et al., "Development and operation of the microshutter array system," Micro (MEMS) and Nanotechnologies for Space, Defense, and Security II, Proceedings vol. 6959, Mar. 16-20, 2008, 13 pages.

(Continued)

*Primary Examiner* — Ahmad F. Matar
*Assistant Examiner* — Sabrina Diaz
(74) *Attorney, Agent, or Firm* — Aikin & Gallant, LLP

(57) ABSTRACT

A portable electronic device comprising: an enclosure having an enclosure wall that forms an interior chamber and a sound output port to an ambient environment; a transducer positioned within the interior chamber and dividing the interior chamber into a front volume chamber coupling a first side of the transducer to the sound output port and a back volume chamber coupled to a second side of the transducer; and an electromechanical valve comprising a number of flaps operable to open and close a vent to the interior chamber, the front volume chamber or the back volume chamber.

19 Claims, 10 Drawing Sheets

(56) References Cited

U.S. PATENT DOCUMENTS

| | | | |
|---|---|---|---|
| 10,469,940 B2 | 11/2019 | Taylor et al. | |
| 2009/0142050 A1* | 6/2009 | Kim | G03B 9/28 |
| | | | 396/480 |
| 2009/0226023 A1* | 9/2009 | Akino | H04R 1/1008 |
| | | | 381/374 |
| 2012/0033831 A1 | 2/2012 | Leitner | |
| 2013/0223023 A1 | 8/2013 | Dehe et al. | |
| 2015/0014796 A1 | 1/2015 | Dehe | |
| 2016/0330546 A1* | 11/2016 | Barrentine | G10K 11/17857 |
| 2017/0029267 A1* | 2/2017 | Jenkins | H04R 1/222 |
| 2018/0091892 A1* | 3/2018 | Taylor | H04R 1/2826 |
| 2018/0233827 A1 | 8/2018 | Agranat et al. | |

OTHER PUBLICATIONS

Syms, R.R.A., et al., "Sliding-blade MEMS iris and variable optical attenuator," Institute of Physics Publishing, Journal of Micromechanics and Microengineering, 14, Sep. 14, 2004, pp. 1700-1710.

Jimenez, Noe, et al., "Ranbow-trapping absorbers: Broadband, perfect and asymmetric sound absorption by subwavelength panels for transmission problems," Scientific Reports, 7:13595, Oct. 19, 2017, 12 pages.

Roy, Nirupam, et al., "Inaudible Voice Commands: The Long-Range Attack and Defense," 15th USENIX Symposium on Networked Systems Design and Implementation, Apr. 9-11, 2018, 15 pages.

* cited by examiner

DYNAMIC VALVE FOR AN ELECTRONIC DEVICE

CROSS-REFERENCE TO RELATED APPLICATIONS

The application is a non-provisional application of co-pending U.S. Provisional Patent Application No. 63/245,570, filed Sep. 17, 2021 and incorporated herein by reference.

FIELD

An aspect of the disclosure is directed to a dynamic valve assembly for an electronic device. Other aspects are also described and claimed.

BACKGROUND

Portable communications or listening devices (e.g., smart phones, earphones, etc.) have within them one or more transducers that convert an input electrical audio signal into a sound pressure wave output that can be heard by the user, or a sound pressure wave input into an electrical audio signal. The transducer (e.g., a speaker) can be used to, for example, output sound pressure waves corresponding to the voice of a far end user, such as during a telephone call, or to output sound pressure waves corresponding to sounds associated with a game or music the user wishes to play. Due to the relatively low profile of the portable devices, the transducers also have a relatively low profile, which in turn, can make it difficult to maintain optimal sound quality.

SUMMARY

An aspect of the disclosure is directed to a dynamic valve that can be used to control an amount of leak between an inner cavity and ambient. Representatively, in the case of earphones, in some cases a perfect seal (high impedance) is desired, whereas in other cases a very open path (low impedance) is desired. Representatively, in some cases, where the earphone fits relatively tightly within the ear and forms a seal with the ear canal, or at least a partial seal, user's may experience an undesirable occlusion effect. For example, during active noise control (ANC) or noise cancellation, the user may want the in-ear device to be isolated with passive isolation and ANC (closed valve) but when outdoors it may be desirable for transparency (open valve) so there is a more natural and lower occlusion effect when speaking. The valve therefore allows for the amount of leak to be dynamically controlled during system operation depending on the desired level of leak, and with lower power consumption.

Representatively, in some aspects, the disclosure is directed to a portable electronic device (e.g., a wearable such as an earphone) including an enclosure having an enclosure wall that forms an interior chamber and a sound output port to an ambient environment; a transducer positioned within the interior chamber and dividing the interior chamber into a front volume chamber coupling a first side of the transducer to the sound output port and a back volume chamber coupled to a second side of the transducer; and an electromechanical valve comprising a number of flaps operable to open and close a vent to the interior chamber, the front volume chamber or the back volume chamber. In some aspects, the number of flaps are operable to open or close the vent to the ambient environment upon application of a voltage. In still further aspects, the vent includes a first opening and a second opening, and the number of flaps comprise a first flap operable to open and close the first opening, and a second flap operable to open and close the second opening. In some aspects, at least one flap of the number of flaps includes an electrode layer and a structural material layer and the flap is coupled to a support member having a first portion arranged perpendicular to the flap. In some aspects, upon application of a voltage, the flap transitions from a closed position to an open position in which it is coupled to the first portion by an electrostatic force. In some aspects, the support member further includes a second portion that runs perpendicular to the first portion and is positioned above the flap, and upon application of a voltage, the flap is coupled to the second portion to close the vent. The flap may further include a piezoelectric layer coupled to the electrode layer. In some aspects, the electrode layer is a first electrode layer, and the flap further includes a second electrode layer coupled to a side of the piezoelectric layer opposite the first electrode layer. In some aspects, the first portion of the support member comprises a tapered portion that reduces a distance the flap moves to transition to an open position. In some aspects, the valve is a first valve, and the device further comprises a second valve having a flap operable to open in an opposite direction to at least one flap of the number of flaps of the first valve to cancel a net air pressure generated by the first valve when transitioning to an open position.

In another aspect, the disclosure is directed to a valve assembly for a portable electronic device including a support member coupled to an enclosure opening, the support member having an insulating layer; and an electromechanical flap movably coupled to the support member, the electromechanical flap comprising a first material layer comprising a metal and a second material layer, and wherein upon application of a voltage, the electromechanical flap is operable to transition between a closed configuration in which the electromechanical flap covers the enclosure opening and an open configuration in which the electromechanical flap uncovers the enclosure opening. The first material layer including the metal may be an electrode layer and the second material layer comprises a structural material coupled to the first material layer, and the second material layer comprises a polysilicon, a silicon nitride, or a single crystalline silicon. In some aspects, the second material layer includes a piezoelectric material. In some aspects, a third material layer is further provided including a metal. In some aspects, the insulating layer is coupled to a surface of the support member running perpendicular to the enclosure opening, and the flap rotates about a hinge toward the insulating layer to the open configuration. In some aspects, the insulating layer is coupled to a surface of the support member running parallel to the enclosure opening and positioned above the flap, and wherein the flap rotates about a hinge toward the insulating layer to the closed configuration. In some aspects, the electromechanical flap includes a first electromechanical flap and a second electromechanical flap. The first electromechanical flap and the second electromechanical flap may be independently operable to transition between the closed configuration in which the first and second electromechanical flaps cover the enclosure opening and the open configuration in which the first and second electromechanical flaps rotate toward the insulating layer of the support member. In some aspects, the opening includes a first opening and a second opening, and the first electromechanical flap is operable to transition between the closed configuration in which the first electromechanical flap covers the first enclosure opening and the open configuration, and the second electromechanical flap is operable to transition between the closed configuration in which the first electromechanical flap covers the second enclosure opening and the open configuration. In some aspects, the support member includes a first end and a second end opposite the first end, the first electromechanical flap is coupled to the first end, the second electromechanical flap is coupled to the second end, and wherein the second electromechanical flap opens in a direction opposite to the first electromechanical flap to cancel a net air pressure generated by the first electromechanical flap when transitioning to the open position.

The above summary does not include an exhaustive list of all aspects of the present disclosure. It is contemplated that the disclosure includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect in this disclosure are not necessarily to the same aspect, and they mean at least one.

DETAILED DESCRIPTION

In this section we shall explain several preferred aspects of this disclosure with reference to the appended drawings. Whenever the shapes, relative positions and other aspects of the parts described are not clearly defined, the scope of the disclosure is not limited only to the parts shown, which are meant merely for the purpose of illustration. Also, while numerous details are set forth, it is understood that some aspects of the disclosure may be practiced without these details. In other instances, well-known structures and techniques have not been shown in detail so as not to obscure the understanding of this description.

The terminology used herein is for the purpose of describing particular aspects only and is not intended to be limiting of the disclosure. Spatially relative terms, such as "beneath", "below", "lower", "above", "upper", and the like may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

As used herein, the singular forms "a", "an", and "the" are intended to include the plural forms as well, unless the context indicates otherwise. It will be further understood that the terms "comprises" and/or "comprising" specify the presence of stated features, steps, operations, elements, and/or components, but do not preclude the presence or addition of one or more other features, steps, operations, elements, components, and/or groups thereof.

The terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps or acts are in some way inherently mutually exclusive.

Figure 1:
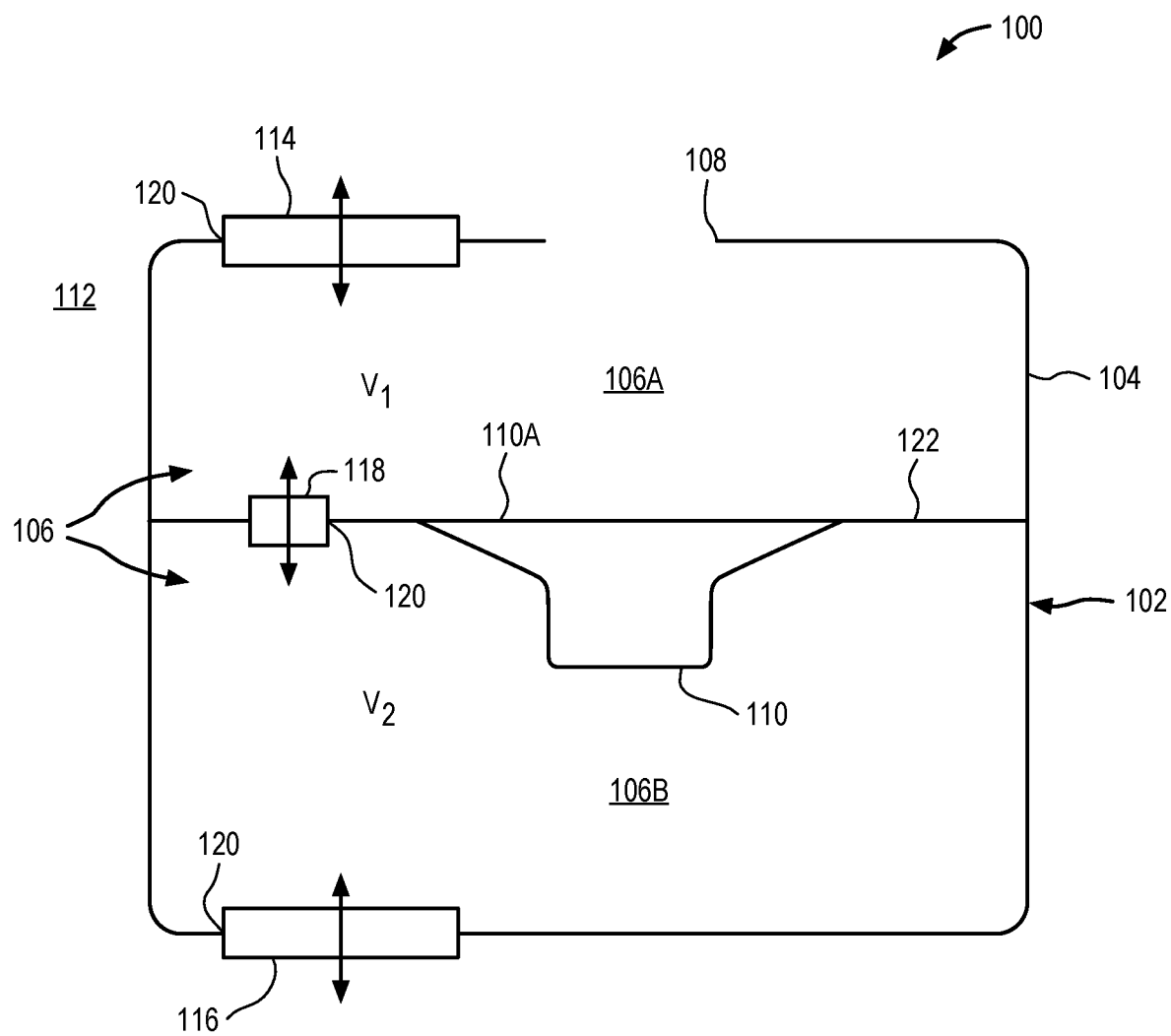
FIG. 1 illustrates a cross-sectional side view of one aspect of a portable electronic device and/or transducer assembly having a valve.

FIG. 1 illustrates a cross-sectional side view of one aspect of a valve assembly for a transducer positioned within a portable electronic device. The electronic device 100 may include a housing, casing or outer enclosure 102 that defines or closes off a chamber in which the constituent electronic components of electronic device 100 are contained. In some aspects, it is contemplated that device 100 may be a portable or mobile communications device, an in-ear device, portable time piece or any other device within which a transducer may be implemented. Enclosure 102 may include an enclosure wall 104 that separates a surrounding environment from an encased space or interior chamber 106 formed within enclosure 102. In some cases, the enclosure wall 104 completely isolates or seals the entire, or a portion of, interior chamber 106 from the surrounding environment. For example, the enclosure wall 104 may form a water-proof or acoustically isolated portion of interior chamber 106 which is impermeable to water and/or air. The interior chamber 106 may be of a sufficient volume and/or size to accommodate the constituent components of electronic device 100. The enclosure wall 104 may also include one or more of an acoustic port 108. The acoustic port 108 may be, for example, a sound output port through which sound from a speaker positioned within interior chamber 106 may be output. In other aspects, where a microphone is positioned near enclosure acoustic port 108, it could be a sound input port to allow for input of sound to the microphone.

Representatively, in one aspect shown in FIG. 1, enclosure acoustic port 108 is an acoustic port that is acoustically open to a transducer 110 positioned within interior chamber 106. In some aspects, transducer 110 may be any type of electroacoustic transducer capable of converting an electrical audio signal into a sound or a sound into an electrical audio signal. Representatively, transducer 110 may be a speaker or a micro-speaker, for example, a miniaturized version of a loudspeaker that uses a moving coil motor to drive sound output. Thus, in some aspects, transducer 110 may be referred to herein as a micro-speaker. In other aspects, where transducer 110 converts sound into an electrical audio signal, it may further be referred to herein as a microphone. In some aspects, transducer 110 may be coupled to an interior wall 122 and be considered to divide interior chamber 106 into a front volume chamber 106A and a back volume chamber 106B around transducer 110. In the case where transducer 110 is a speaker, front volume chamber 106A may form a chamber having a first volume (V1) around the sound output face or surface 110A of transducer 110. The front volume chamber 106A (and first volume V1) may be considered acoustically coupled to, or otherwise open to, acoustic port 108. In this aspect, sound pressure waves output from surface 110A of transducer 110 may pass through front volume chamber 106A and out to the surrounding ambient environment 112 through acoustic port 108. Back volume chamber 106B may have a second volume (V2) and surround the back side of transducer 110 (e.g., the side of transducer 110 opposite surface 110A).

It is recognized that, for example, a size, volume, pressure or other aspects of front volume chamber 106A or back volume chamber 106B may impact the acoustic performance of transducer 110. Thus, modifying the size, volume and/or pressure of front volume chamber 106A and/or back volume chamber 106B may be used to tune the acoustic performance of transducer 110. For example, in some cases, it may be desirable for front volume chamber 106A and/or back volume chamber 106B to be isolated or sealed (e.g., high impedance) from the ambient environment 112 to achieve the desired acoustic performance. In other cases, it may be desirable for front volume chamber 106A and/or back volume chamber 106B to have a very open path (e.g., low impedance) and have some amount of leak to the surrounding ambient environment 112. In still further aspects, it may be desirable for front volume chamber 106A to have a leak, or otherwise be open to, back volume chamber 106B.

With this in mind, valve assemblies or valve(s) 114, 116 and/or 118 may further be provided to vent an associated chamber. Valve 114, 116, and/or 118 may open and/or close a vent or opening 120 from front volume chamber 106A and/or back volume chamber 106B to the ambient environment 112, or a vent or opening 120 between front and back volume chambers 106A-B. Representatively, valve 114 may open and/or close opening 120 formed through wall 104 between front volume chamber 106A and ambient environment 112. In other words, when valve 114 is open, front volume chamber 106A can leak or vent to ambient environment 112 and when valve 114 is closed, the leak or venting is prevented. A leak or venting may be desired from front volume chamber 106A where, for example, device 100 is an in-ear earpiece sealed within the user's ear but a more open feel is desired. Valve 116 may open and/or close opening 120 through wall 104 between back volume chamber 106B and ambient environment 112. In other words, when valve 116 is open, front volume chamber 106A can leak or vent to back volume chamber 106B, and when valve 116 is closed, the leak or venting is prevented. Valve 118 may open and/or close opening 120 through wall 122 between front volume chamber 106A and back volume chamber 106B. In this aspect, when valve 118 is open, back volume chamber 106B can leak or vent to back volume chamber 106B, and when valve 118 is closed, the leak or vent is prevented. In still further aspects, it is contemplated that one or more of valves 114, 116, 118 could be used to open and/or close an opening (e.g., opening 120) which is to another type of acoustic chamber, for example, an opening to an acoustic resonator or attenuator coupled to one or more of the previously discussed chambers or ports of the transducer.

In one aspect, one or more of valves 114, 116, 118 may be electromechanical valves that open and/or close in response to the application of a voltage. In this aspect, valves 114, 116, 118 may be dynamically actuated to control the amount of leak. In some aspects, one or more of valves 114, 116, 118 may be micro-electromechanical systems (MEMS) actuators or valves. Valves 114, 116, 118 may be the same, or may be different. In some aspects, one or more of valves may offer the advantages of bistability, low power consumption switching from on/off states, digitization for controlling a percentage or amount of open area for venting, and/or silent operation. A number of representative configurations for valves 114, 116, 118 will now be described in reference to FIG. 2-FIG. 8B.

Figure 2:
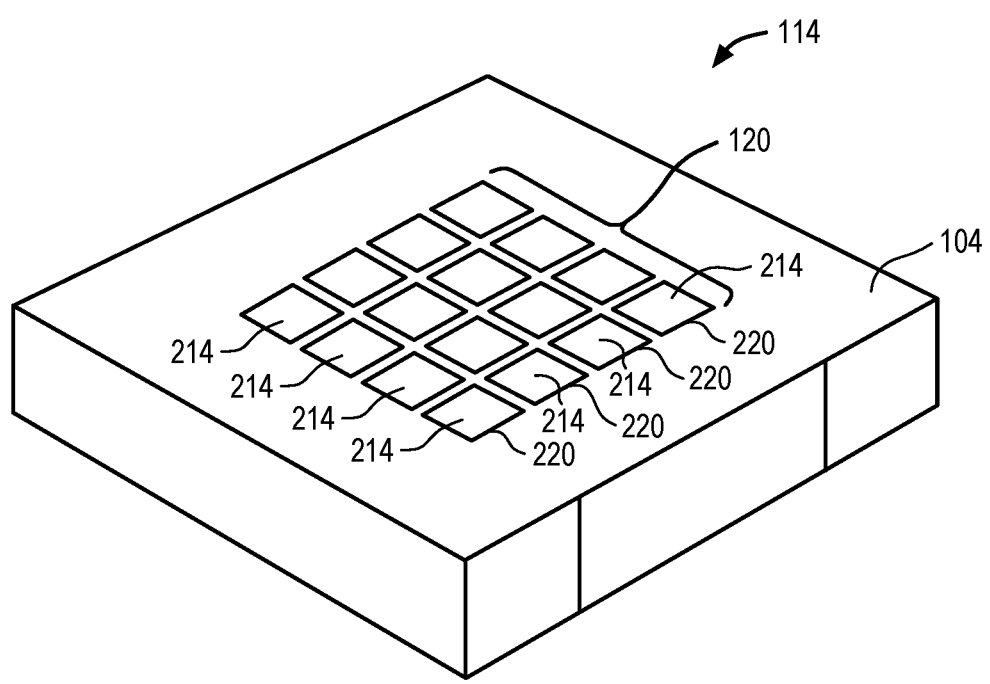
FIG. 2 illustrates a perspective view of one aspect of a valve of the portable electronic device and/or transducer assembly of FIG. 1.

Representatively, FIG. 2 illustrates a magnified top perspective view of a representative valve from FIG. 1. In this aspect, FIG. 2 shows valve 114 used to open/close opening 120 formed in enclosure wall 104. It should be understood, however, that although valve 114 is specifically discussed, one or more of valves 116 and/or 118 may be the same as valve 114 such that the description provided herein also applies to any other valves disclosed in FIG. 1. From this view, it can be seen that opening 120 includes a number of openings 220 and valve 114 includes a number of flaps 214 configured to open/close a respective one of the openings 220. Representatively, openings 220 may be an array of openings 220 that together make up opening 120. In this aspect, openings 220 may be relatively small, for example, from about 1 mm to about 3 mm. Similarly, valve 114 includes an array of flaps 214 that are positioned over a respective one of openings 220 to open/close each opening 220 as desired. For example, the combination of openings 220 and flaps 214 may make up a 4×4 array of valves as shown, although more or fewer valves may be included in the array. For example, the valves may be arranged in a 5×5 array, a 6×6 array or the like. It should be understood, however, that valves may be in arrangements or patterns other than an array as desired. In addition, it should be understood that while square shaped openings 120 and/or flaps 214 are shown, other polygon or non-polygon shapes and sizes of openings 120 and/or flaps 214 are contemplated (e.g., triangular, rectangular, circular, etc.). The size and shape of openings 120 and flaps 214 should be complimentary such that the flaps 214 are of a sufficient size and/or shape to cover the openings 220 in the closed configuration and uncover the openings 220 in the open configuration. It further may be understood that in some aspects, each of flaps 214 may be individually controlled by application of a voltage such that some may be open (e.g., not covering a respective opening 220) while others may be closed (e.g., covering a respective opening 220) depending on the desired level of venting. The opening and/or closing of flaps 214 may be driven in parallel or separately controlled by the application of a voltage to give a variable impedance control. For example, in some aspects, the application of an electric voltage may be used to open flaps 214, but once opened they may be considered "latched", and can remain latched while almost reducing the power to virtually zero. In this aspect, valves 114 consume a relatively low amount of power when transitioning between open/closed states or configurations.

Figure 3A:
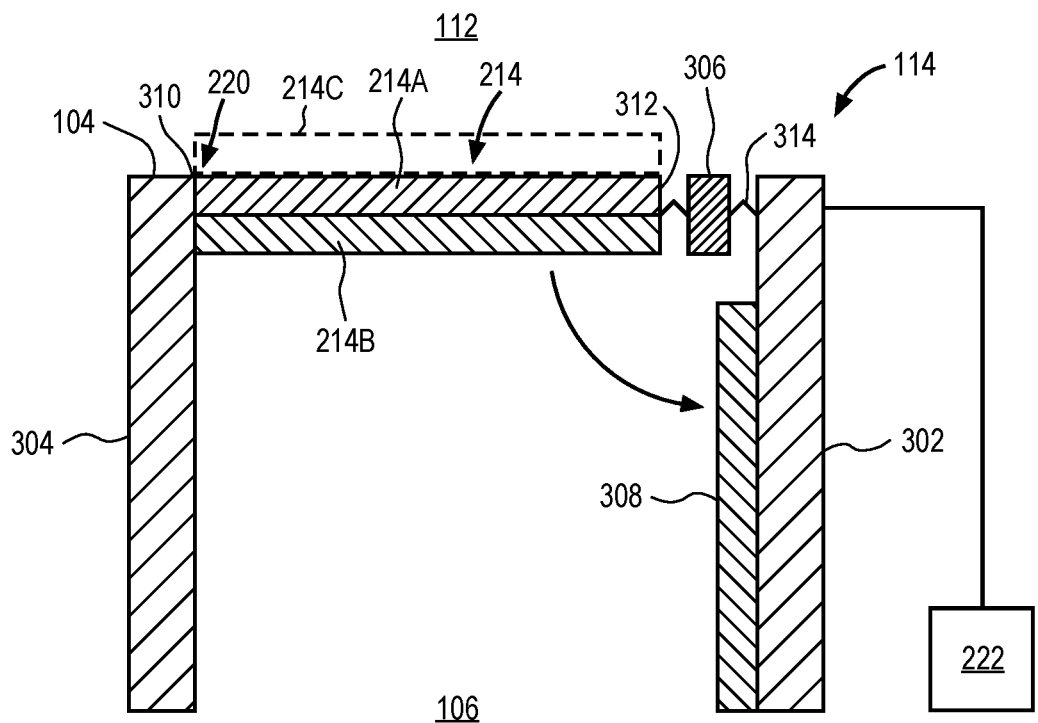
FIG. 3A illustrates a cross-sectional side view of one aspect of a valve of a portable electronic device and/or transducer assembly of FIG. 2 in a closed configuration.
Figure 3B:
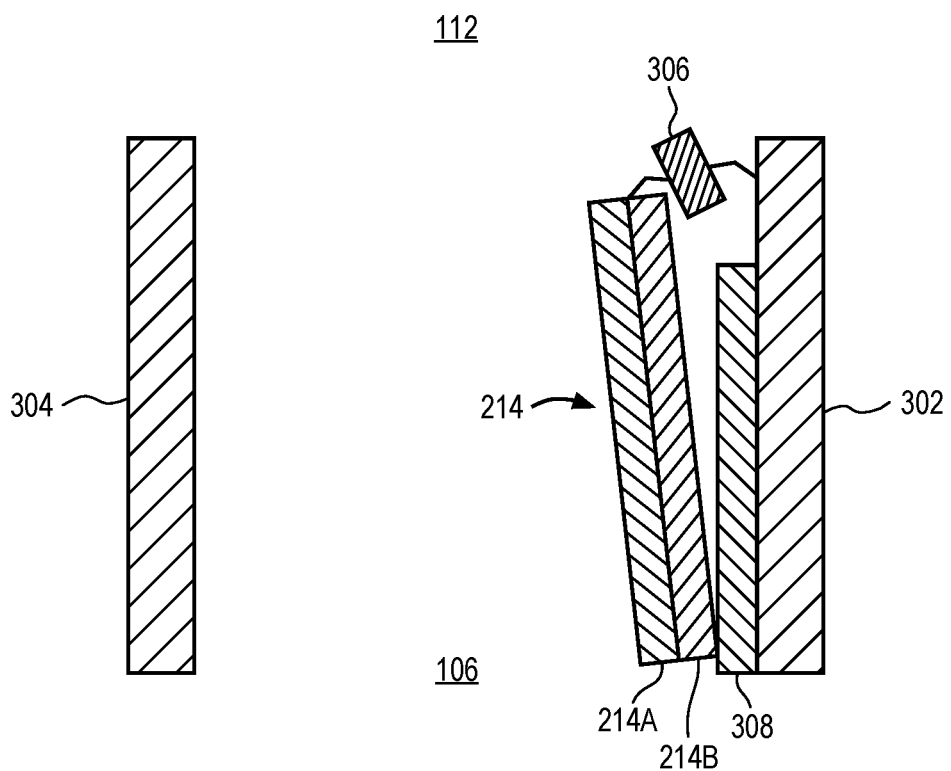
FIG. 3B illustrates a cross-sectional side view of one aspect of a valve of a portable electronic device and/or transducer assembly of FIG. 2 in an open configuration.

Representatively, FIGS. 3A-3B illustrate a cross-sectional side view of one aspect of a valve assembly from FIG. 2. In particular, FIGS. 3A-3B illustrate representative aspects of valve 114 from FIG. 2. It should be understood, however, that although valve 114 is specifically discussed, one or more of valves 116 and/or 118 may be the same as valve 114 such that the description provided herein also applies to any other valves disclosed herein. Referring now to valve 114, it can be seen from this view that valve 114 includes at least one flap 214 that is coupled to support member 302 by a hinge 306. It should be recognized that although the term "flap" is used herein, flap 214 may be any structure suitable for opening and/or closing opening 220 as discussed herein. Flap 214 and/or support member 302 may include materials that allow for the opening and/or closing of flap 214 relative to opening 220 upon application of a voltage and electrostatic forces. Representatively, flap 214 may include a first material layer 214A that is made of a metal material and a second material layer 214B that is made of a structural material. In some aspects, flap 214 may further include an optional material layer 214C that is the same as second material layer 214B and first material layer 214A may be sandwiched between layers 214B and 214C. The materials for layers 214A-214B and optional layer 214C may be any MEMS material. For example, first material layer 214A may be made of a metal material including, but not limited to, gold, aluminum or the like. In some aspects, first material layer 214A may be referred to herein as an electrode layer, or as including an electrode. Second material layer 214B and material layer 214C may be made of a structural material including, but not limited to, polysilicon, silicon nitride, silicon carbide, single crystalline silicon, or polymer MEMS materials in general. The first material layer 214A and second material layer 214B may be fixedly attached to one another (e.g., during a processing operation, using an adhesive, etc.) to form flap 214. In some aspects, the material layer 214C may be fixedly attached to a side of first material layer 214A opposite the second material layer 214B to provide environmental protection and/or better stress control to flap 214. Flap 214 may include a first end 310 that is considered free to move between open and/or closed positions, and a second end 312 that is coupled to hinge 306 and drives the movement of free end 310. In some aspects, hinge 306 may include a spring or biasing mechanism 314 that biases flap 214 toward the closed or horizontal position in which flap 214 covers opening 220 as shown in FIG. 3A. In this aspect, in the resting state shown in FIG. 3A (e.g., no voltage is applied), flap 214 will remain closed or otherwise in a position such that it is covering opening 220. The application of a sufficient voltage to flap 214, however, will create an attractive force between flap 214 and support member 302 that overcomes the biasing force of the hinge 306. This, in turn, causes flap 214 to move or rotate (as shown by the arrow) toward support member 302 to the open position (or vertical position) in which it is not covering opening 220 and latch to support member 302 due to the electrostatic forces, as shown in FIG. 3B.

In this aspect, support member 302 may include a material that allows flap 214 to rotate toward support member 302 and latch to support member 302 upon application of a force. Representatively, support member 302 may be a perpendicularly extending part (or wall) of a substrate or enclosure wall and include an insulating material 308 attached to a side or surface facing flap 214. For example, support member 302 may be considered to run perpendicular to the opening 220 as shown. In some aspects, support member 302 may be made of a single crystal silicon, a quartz or a glass material, and the insulating material 308 may be, for example, an aluminum oxide or silicon dioxide material layer. Upon application of a voltage to flap 214, the voltage will slowly start applying force on the flap 214. The voltage may be continually increased until an attractive force is generated that causes flap 214 to move or rotate toward support member 302 and latch thereto. It should further be understood that once latched, flap 214 can stay latched while almost reducing the power to zero due to electrostatic forces. Once, however, the voltage is decreased to a certain threshold value, the spring/mechanical force of hinge 306 will overcome the electrostatic force causing flap 214 to rotate back to the closed position shown in FIG. 3A. In this aspect, it may be understood that to open/close flap 214 there is a critical voltage that may be used to keep flap 214 open and upon reducing the voltage, there is some hysteresis that occurs allowing flap 214 to remain latched for a period of time using the electrostatic forces that were generated. At some point, however, this is overcome by the biasing force of the hinge 306 and flap 214 will go back to the closed position. For example, to open flap 214, up to approximately 50 volts may be applied to flap 214, this may then be reduced to 40 volts with flap 214 remaining latched. Upon further reducing the voltage to 30 volts, flap 214 may stay latched for a period of time due to hysteresis until eventually the spring force overcomes any remaining forces causing flap 214 to rotate back to the closed position. In some aspects, the device may have an application-specific integrated circuit (ASIC) 222 that could be next to flap 214 that connects with and is used to apply the voltage necessary to dynamically control flap 214.

Referring now in more detail to support member 302, support member 302 may, in some aspects, be a wall or structure that extends from the enclosure wall 104, into the interior chamber 106 defined by enclosure wall 104. For example, support member 302 may be a wall or structure coupled to, or formed by the enclosure wall and/or a substrate or other material within which the valve assembly is implemented. Support member 302 may extend perpendicularly from a portion of enclosure wall 104 defining opening 220. In some aspects, another support member 304 may also be provided and extend perpendicularly from a portion of enclosure wall 104 defining opening 220. Support member 302 and support member 304 may surround opening 220. In some aspects, support member 302, 304 may be one integrally formed wall or structure that is formed partially or entirely around opening 220. In this aspect, support members 302, 304 may form an interior chamber below opening 220 and within which flap 214 may be received when it moves toward support member 302 (e.g., to an open or vertical position) as previously discussed and shown in FIG. 3B. As can further be seen from FIG. 3A, when flap 214 is closed, the enclosure interior chamber 106 is closed, or sealed off, from ambient environment 112. On the other hand, when flap 214 is in the open position, as shown in FIG. 3B, interior chamber 106 is open, or shares a volume, with ambient environment 112. The opening and closing of flap 214 can be dynamically controlled as previously discussed. In addition, each flap 214 in the array of flaps making up the valve 114 discussed in reference to FIG. 2 may be individually controlled so that the total open area of opening can be selected to match the desired leak. For example, where the largest opening or leak is desired, all flaps 214 may be opened, where a smaller leak is desired, some flaps 214 may be opened while others may be closed.

Figure 4A:
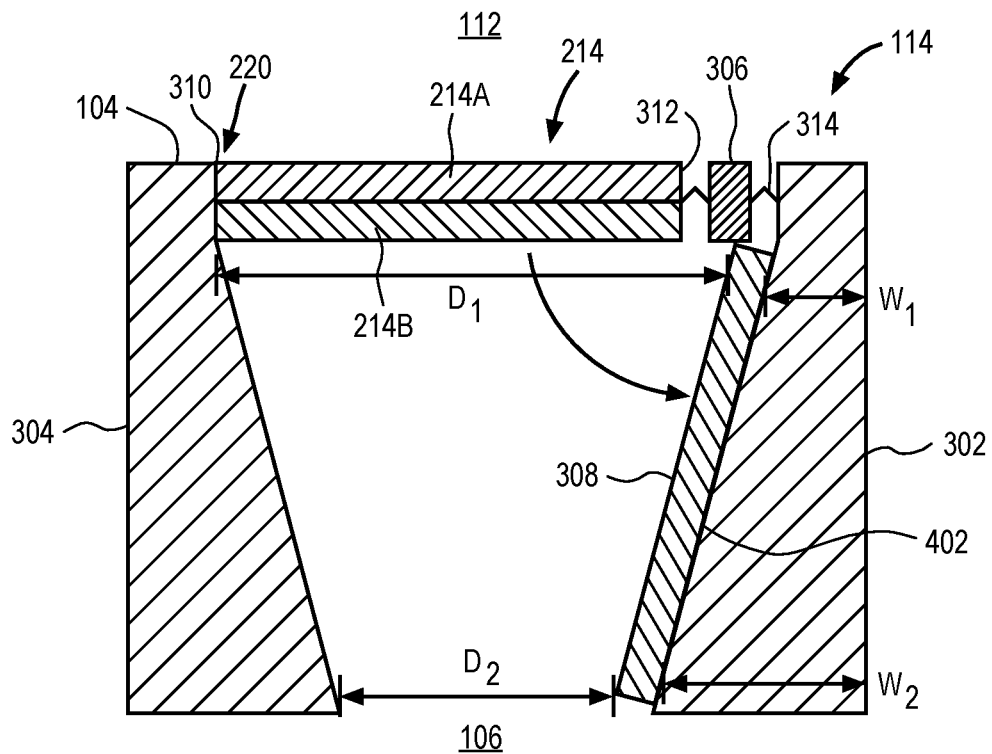
FIG. 4A illustrates a cross-sectional side view of one aspect of a valve of a portable electronic device and/or transducer assembly of FIG. 2 in a closed configuration.
Figure 4B:
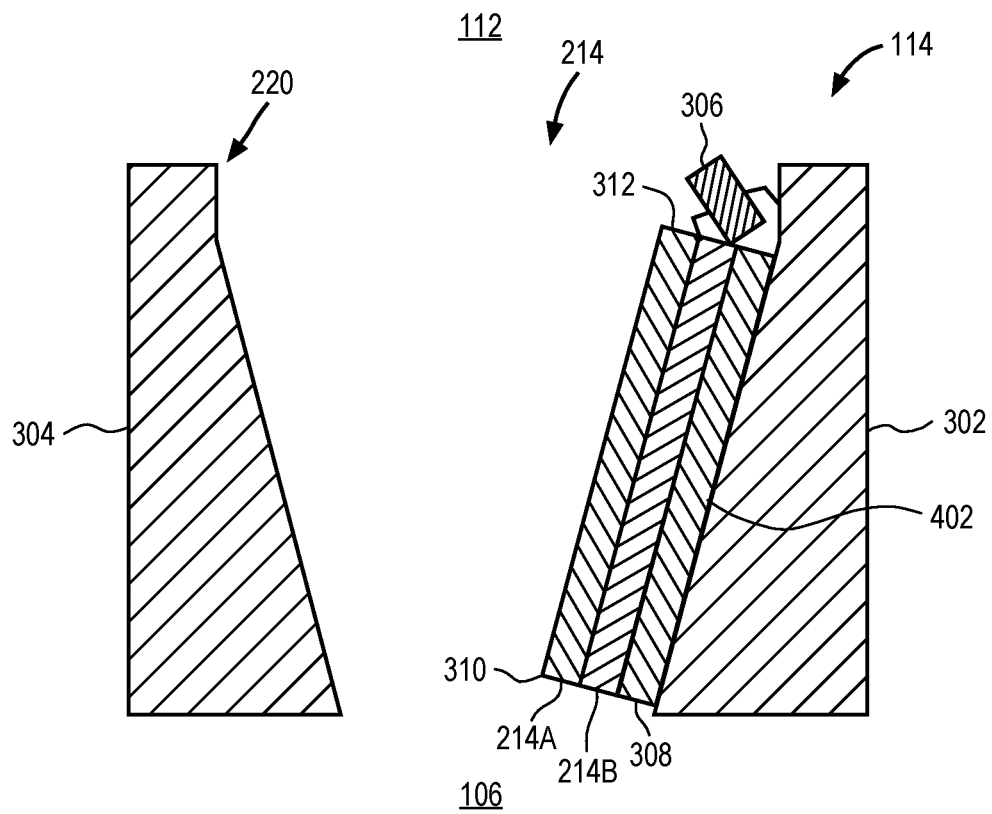
FIG. 4B illustrates a cross-sectional side view of one aspect of a valve of a portable electronic device and/or transducer assembly of FIG. 2 in an open configuration.

FIGS. 4A-4B illustrate cross-sectional side views of another aspect of a valve assembly from FIG. 2. In particular, FIGS. 4A-4B illustrate representative aspects of valve 114 from FIG. 2. Valve 114 shown in FIGS. 4A-4B is substantially similar to the valve described in reference to FIGS. 3A-3B in that it includes flap 214, connected to support member 302 by hinge 306. Similar to the previously discussed flaps, flap 214 may include a first material layer 214A (e.g., a metal material layer) and a second material layer 214B (e.g., a structural material layer). Support member 302 may include an insulating material 308 attached to a side or surface of support member 302 facing flap 214. In this aspect, upon application of a voltage as previously discussed, flap 214 will be caused to rotate in the direction of the arrow toward support member 302. Flap 214 rotates until it contacts support member 302 and latches to support member 302 as previously discussed.

In this configuration, however, support member 302 (and support member 304) may include an angled, sloped or tapered configuration such that the distance flap 214 must move to contact and latch to support member 302 is reduced from that which the support member is not tapered (e.g., as shown in FIGS. 3A-3B). In particular, the interior surface 402 of support member 302, which faces the interior chamber, may slope in an outward direction at the end furthest from flap 214. For example, support member 302 may have a first width dimension (W1) at the end closest to flap 214 and increase to a second width dimension (W2) at the end furthest from flap 214. The slope or angle of support member 302 decrease the distance between support member 302 and support member 304 from a first distance D1 (at the top of the chamber) to a second distance D2 (at the bottom of the chamber). This, in turn, decreases the distance flap 214 must move to contact support member 302 and reach the open/latched position. For example, whereas in the previous configuration, flap 214 had to move across the entire distance D1 to contact the support member, in this configuration, flap 214 need only move across the distance D2 to contact support member 302. It should further be understood that since the distance flap 214 moves to reach the open/latched position is reduced, the voltage required to reach the open/latched position may also be reduced.

Figure 5A:
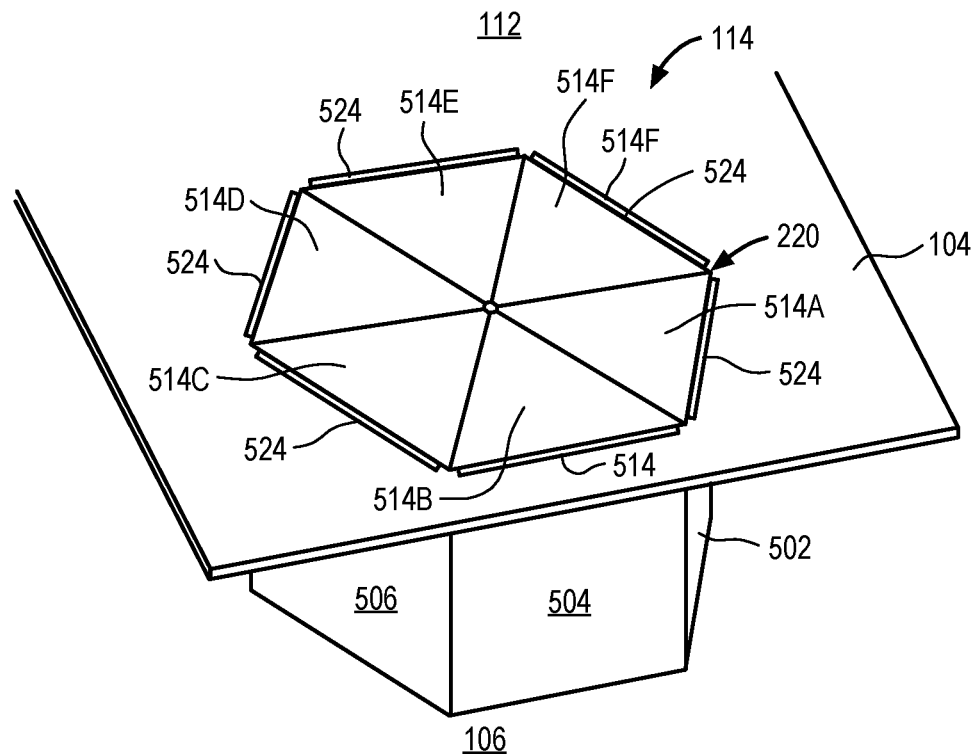
FIG. 5A illustrates a side perspective view of one aspect of a valve of a portable electronic device and/or transducer assembly of FIG. 2 in a closed configuration.
Figure 5B:
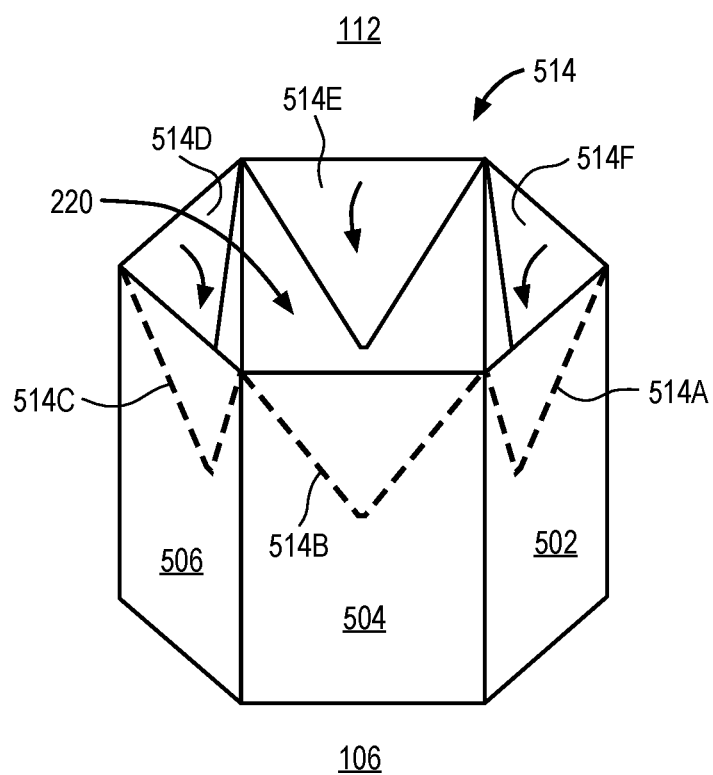
FIG. 5B illustrates a side perspective view of one aspect of a valve of a portable electronic device and/or transducer assembly of FIG. 2 in an open configuration.

Referring now to FIGS. 5A-5B, FIGS. 5A-5B illustrate side perspective views of another aspect of a valve assembly. In particular, FIGS. 5A-5B illustrate representative aspects of valve 114 from FIG. 2. Valve 114 is similar to the previously discussed valves, however, in this configuration, valve 114 includes a number of flaps 514A, 514B, 514C, 514D, 514E and 514F arranged over opening 220. Opening 220 may be formed in enclosure wall 104 and, in this aspect, have a hexagonal shape as shown. Each of flaps 514A-F may be triangularly shaped and attached to enclosure 104 and/or surrounding support members 502, 504, 506 at their widest end by a hinge 524. In this aspect, the point of each of the triangularly shaped flaps 514A-F face the center of opening 220 and when they are arranged together over opening 220 as shown, they form a similar hexagonal shape to opening 220. FIG. 4A illustrates flaps 514A-F in a closed configuration in which they cover, or are otherwise considered to close, opening 220 so that the interior chamber 106 is closed off from the ambient environment 112. To open flaps 514A-F, a voltage as previously discussed is applied, causing flaps 514A-F to rotate inward and toward an inner surface of a respective one of the support members 502, 504, 506 to which they are coupled. Flaps 514A-F, hinges 524 and support members 502, 504, 506 may be substantially similar to the previously discussed flaps, hinges and support members such that upon application of a voltage, an electrostatic force is created that draws flaps 514A-F inward toward support members 502, 504, 506. In this aspect, although not shown, insulating layers may be formed on the interfacing surfaces of support members 502, 504, 506 similar to those previously discussed in reference to FIGS. 3A-3B. The flaps 514A-F may then remain latched to a respective one of support members 502, 504, 506 until the force is less than that of the biasing force of hinges 524. At which point, the biasing force of hinges 524 overcomes the electrostatic force and causes flaps 514A-F to transition back to the closed configuration shown in FIG. 4A. As previously discussed, each of flaps 514A-F may be individually controlled such that all may be closed, all may be opened, or only some of flaps 514A-F may be closed/opened depending on the level of leak desired. It should further be understood that while a single valve assembly 114 and opening 220 are shown in enclosure 104, there may be an array of valve assemblies 114 and openings 220 as previously discussed in reference to FIG. 2.

Figure 6A:
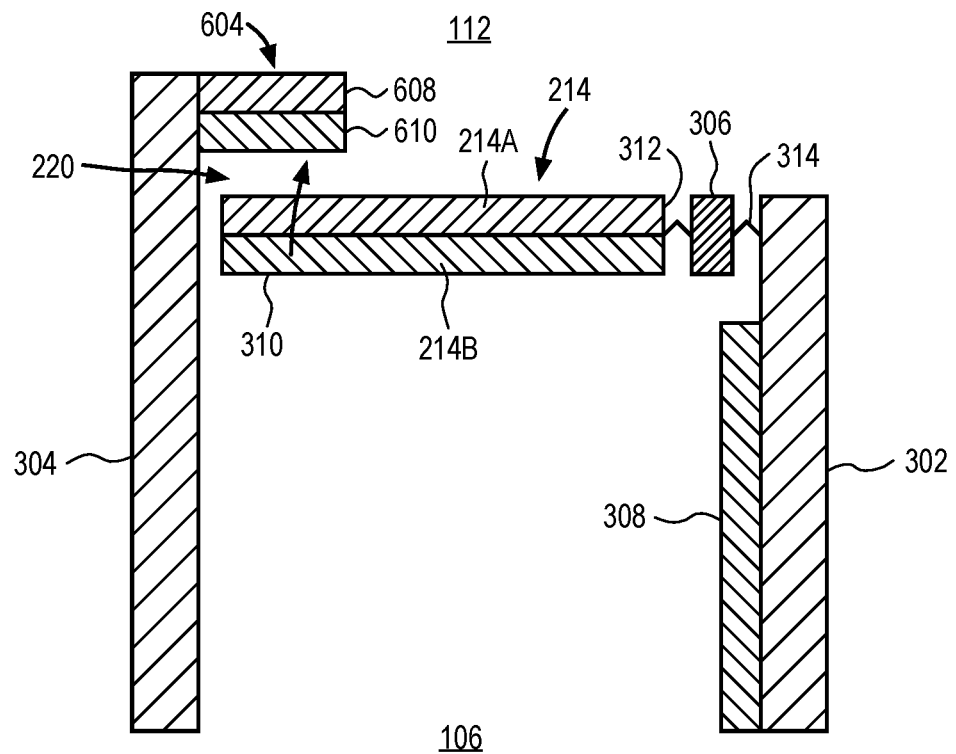
FIG. 6A illustrates a cross-sectional side view of one aspect of a valve of a portable electronic device and/or transducer assembly of FIG. 2 in an open configuration.
Figure 6B:
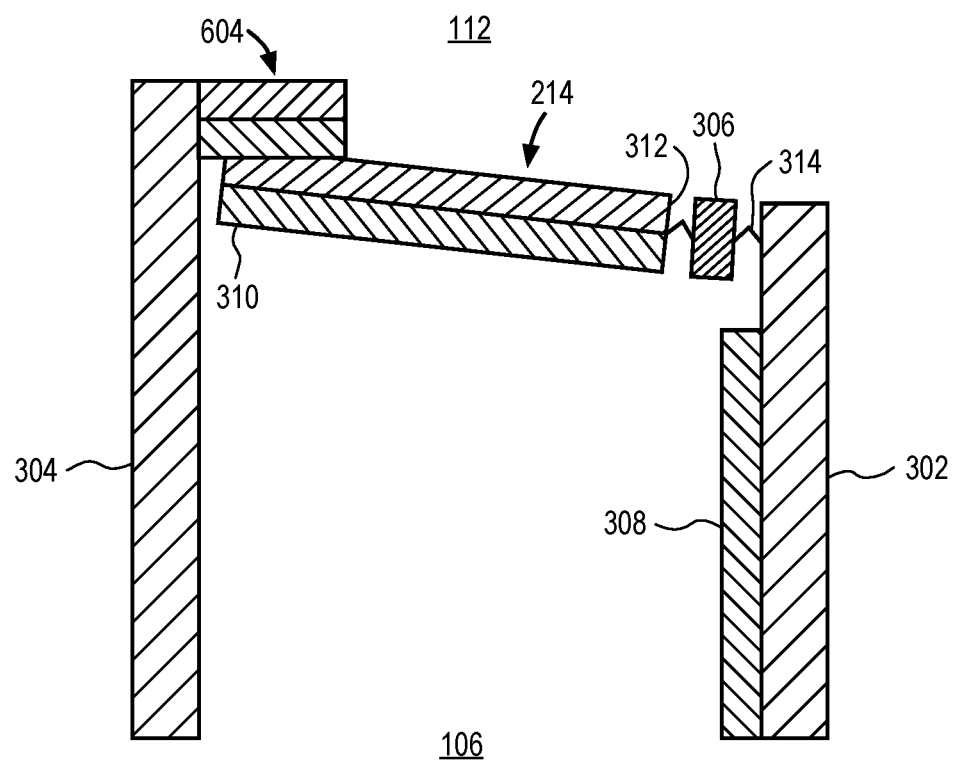
FIG. 6B illustrates a cross-sectional side view of one aspect of a valve of a portable electronic device and/or transducer assembly of FIG. 2 in a closed configuration.

FIGS. 6A-6B illustrate cross-sectional side views of another aspect of a valve assembly from FIG. 2. In particular, FIGS. 6A-6B illustrate representative aspects of valve 114 from FIG. 2. Valve 114 shown in FIGS. 6A-6B is substantially similar to the valve described in reference to FIGS. 3A-4B in that it includes flap 214, connected to support member 302 by hinge 306. Similar to the previously discussed flaps, flap 214 may include a first material layer 214A (e.g., a metal material layer) and a second material layer 214B (e.g., a structural material layer). Flap 214 may be attached to support member 302 at one end 312 by hinge 306 and the other end 310 near support member 304 may be considered a free end. Support member 302 may include an insulating material or layer 308 attached to a side facing flap 214.

In this configuration, however, flap 214 moves in a reverse direction to close opening 220 upon application of a voltage. Representatively, flap 214 may be coupled to support member 302 by a reverse hinge 306. Reverse hinge 306 may bias flap 214 toward the horizontal position shown in FIG. 6A, which in this case is the open position. Support member 304 may include a second upper or latching portion 604 that is perpendicular to the first lower portion, which runs perpendicular to opening 220 as shown. For example, portion 604 may be arranged such that it extends over the free end 310 of flap 214 and parallel to opening 220, while the lower portion of support member 304 extends below opening 220. Representatively, support member 304 may, in this aspect, be an "L" shaped structure with the latching portion 604 extending over the free end 310 of flap 214 and the remaining portion extending below opening 220. Latching portion 604 may include an insulator material 608 and a structural material 608. Upon application of a voltage, flap 214 rotates from the open (horizontal) position shown in FIG. 6A in an upward direction toward latching portion 604. Flap 214 rotates upward until it contacts latching portion 604, which in turn, closes the opening 220 as shown in FIG. 6B. Flap 214 may remain in the closed position until the electrostatic forces are overcome by the biasing force of the hinge 306 causing flap 214 to move back to the open (horizontal) position shown in FIG. 6A. Since, similar to the configuration of FIGS. 4A-4B, flap 214 does not need to move as far to contact latching portion 604, the voltage required to transition flap 214 from the open to closed position may be reduced. In addition, once in the closed or latched position of FIG. 6B, flap 214 will remain held in place for a period of time without application of the voltage as previously discussed, thus while held in place in the closed/latched position the power consumption is virtually zero. It may further be understood that another advantage of this configuration is that latching portion 604 acts as a mechanical stopper to avoid mechanical failure in large pressure inputs.

Figure 7A:
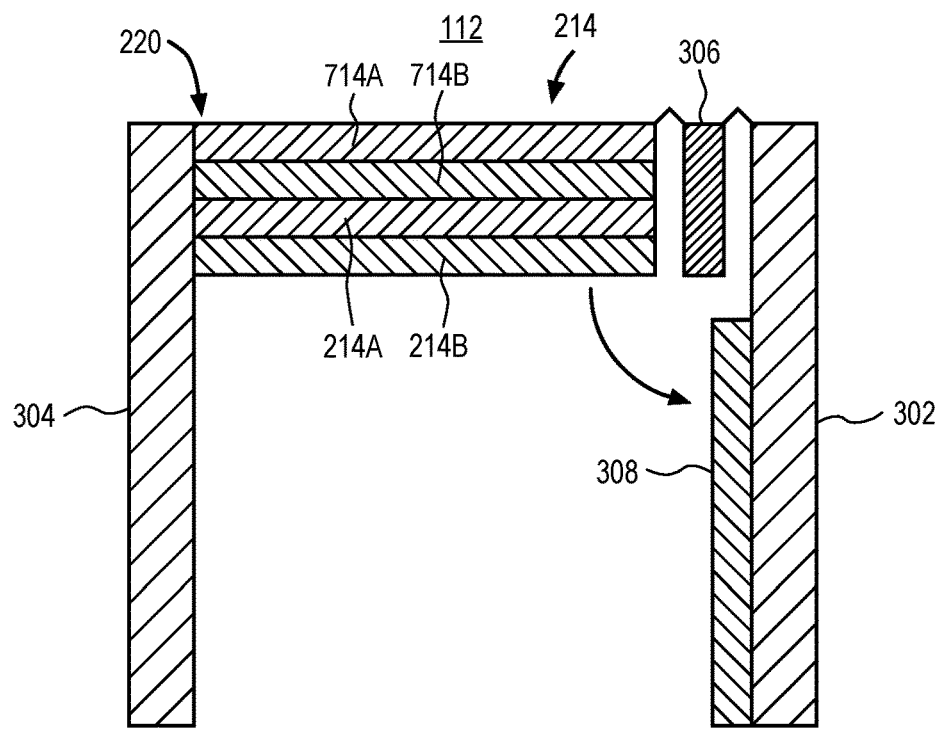
FIG. 7A illustrates a cross-sectional side view of one aspect of a valve of a portable electronic device and/or transducer assembly of FIG. 2 in a closed configuration.
Figure 7B:
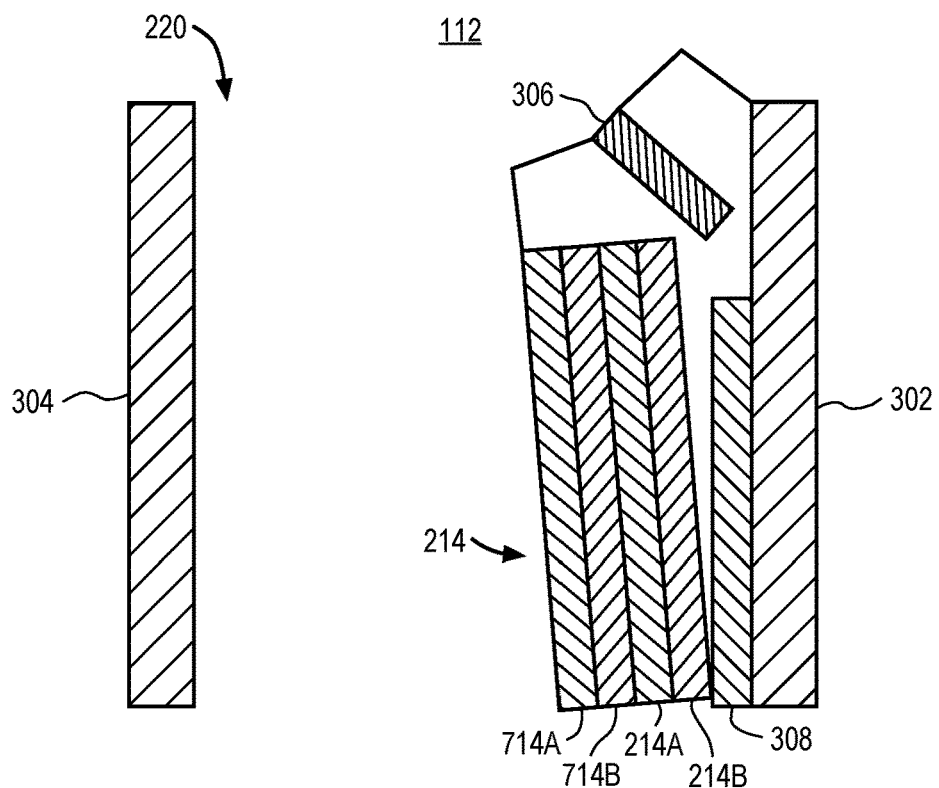
FIG. 7B illustrates a cross-sectional side view of one aspect of a valve of a portable electronic device and/or transducer assembly of FIG. 2 in an open configuration.

FIGS. 7A-7B illustrate a cross-sectional side view of another aspect of a valve assembly from FIG. 2. In particular, FIGS. 7A-7B illustrate representative aspects of valve 114 from FIG. 2. Valve 114 shown in FIGS. 7A-7B is substantially similar to the valve described in reference to FIGS. 3A-3B in that it includes flap 214, connected to support member 302 by hinge 306. Similar to the previously discussed flaps, flap 214 may include a first material layer 214A (e.g., a metal material layer) and a second material layer 214B (e.g., a structural material layer). In this configuration, flap 214 further includes a third material layer 714B and a fourth material layer 714B. For example, the third material layer 714B may be a piezoelectric layer and fourth material layer 714B may be a metal layer. In some aspects, the first material or metal layer 214A may be considered a common electrode and the fourth material or metal layer 714A may be considered a counter electrode. Similar to the previously discussed configurations, the assembly may further include support member 302 and support member 304. Support member 302 may include an insulating material 308 attached to a side facing flap 214. In this aspect, upon application of a voltage as previously discussed, flap 214 will be caused to rotate in the direction of the arrow toward support member 302. Flap 214 rotates until it contacts support member 302 and latches to support member 302 as previously discussed.

Referring now in more detail to flap 214, the addition of the third material layer 714A including a piezoelectric material and the fourth material layer 714B including an electrode provides a combined actuation mechanism that can further help to reduce the voltage requirement. For example, flap 214 can be actuated using a combination of capacitive/piezoelectric or capacitive/thermal bimorph actuation mechanisms to reduce the voltage requirement. Representatively, the piezoelectric layer of third material layer 714A may provide significant bending force which can be used to cause an initial movement of flap 214 at a reduced voltage. For example, in configurations without the piezoelectric layer, to move flap 214 from 0-30 degrees angle of rotation, a relatively significant voltage is required. The addition of the third material layer 714A including a piezoelectric layer allows for the application of a relatively small voltage initially which causes the flap 214 to bend slightly due to the deflection of the piezoelectric material. This slight bend provides an initial rotational kick to the flap 214 at a lower voltage than the previously discussed configurations. After the initial rotational kick at the reduced voltage, the voltage can be increased to fully rotate flap 214 to the latched position. The overall voltage, however, required to open/close flap 214 is considered reduced in comparison to a valve without a piezoelectric layer.

Figure 8A:
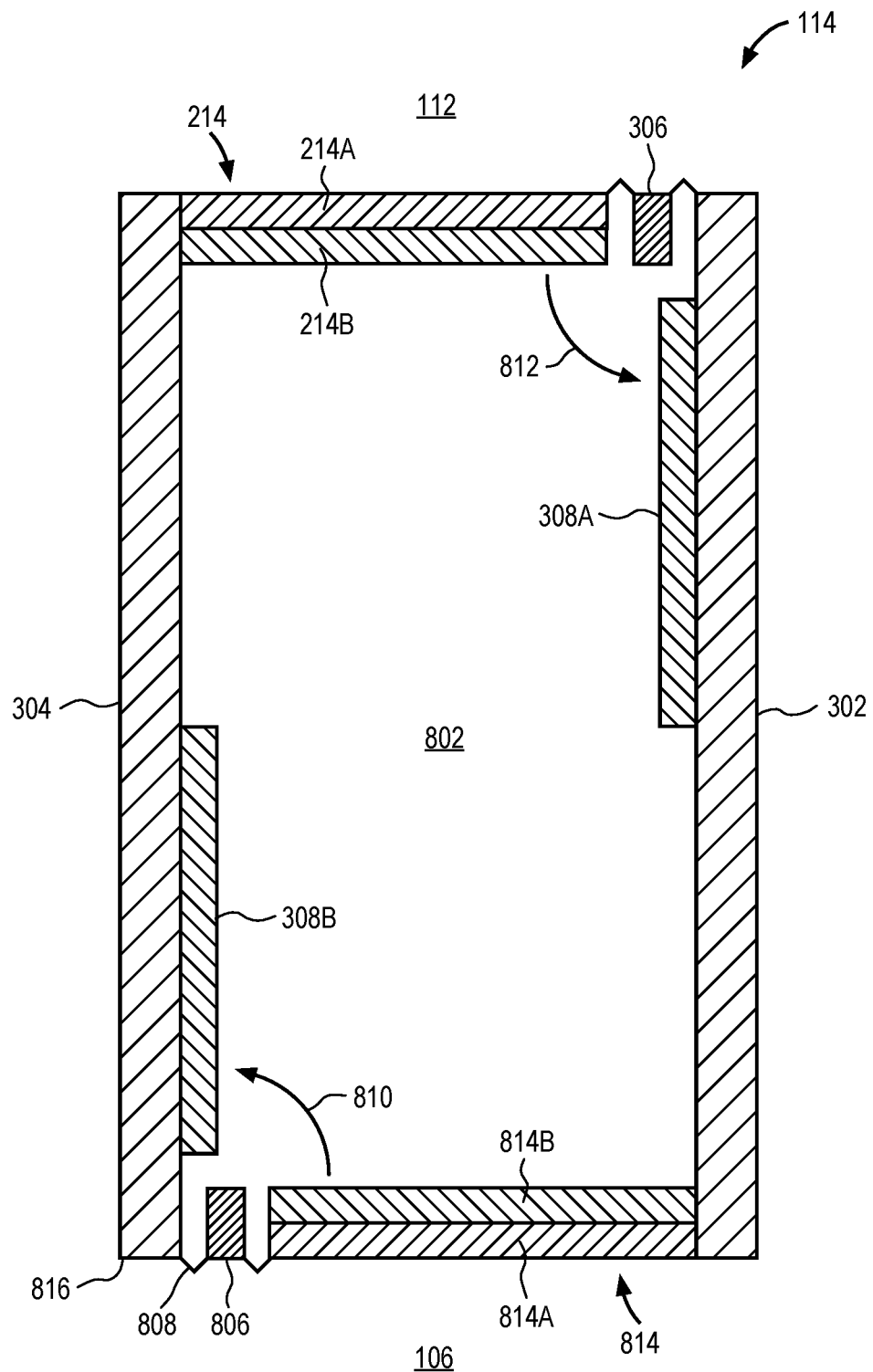
FIG. 8A illustrates a cross-sectional side view of one aspect of a valve of a portable electronic device and/or transducer assembly of FIG. 2 in a closed configuration.
Figure 8B:
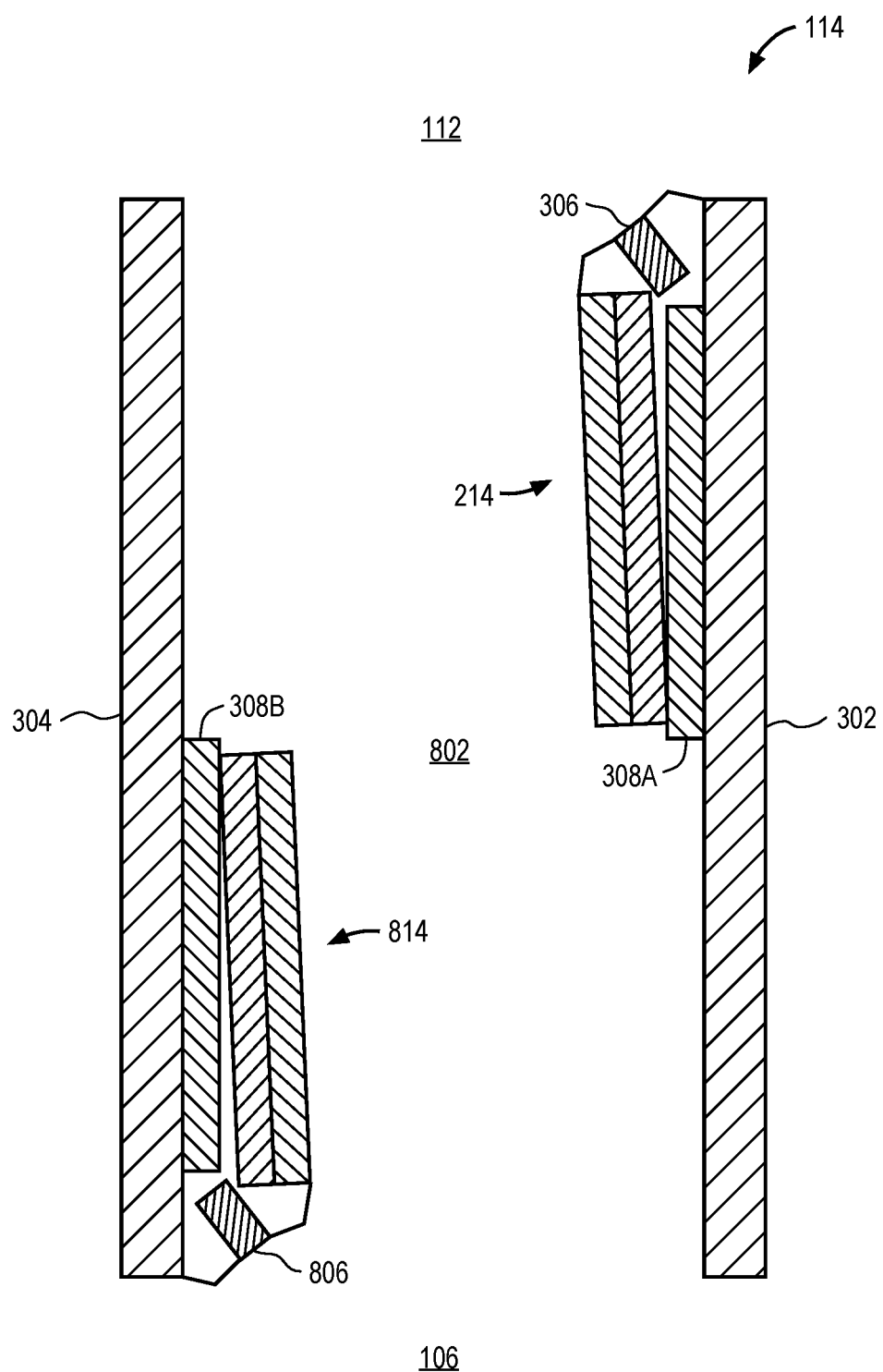
FIG. 8B illustrates a cross-sectional side view of one aspect of a valve of a portable electronic device and/or transducer assembly of FIG. 2 in an open configuration.

FIGS. 8A-8B illustrate cross-sectional side views of another aspect of a valve assembly from FIG. 2. In particular, FIGS. 8A-8B illustrate representative aspects of valve 114 from FIG. 2. Valve 114 shown in FIGS. 8A-8B is substantially similar to the valve described in reference to FIGS. 3A-3B in that it includes flap 214, connected to support member 302 by hinge 306 as well as a second support member 304. Support member 302 may include an insulating layer 308A (e.g., an aluminum oxide layer) as previously discussed. Similar to the previously discussed flaps, flap 214 may include a first material layer 214A (e.g., a metal material layer) and a second material layer 214B (e.g., a structural material layer). Flap 214 transitions from the closed (horizontal) configuration shown in FIG. 8A to the open (vertical) configuration shown in FIG. 8B upon application of a voltage as previously discussed.

In this configuration, however, valve 114 further includes an opposing flap 814 that will cancel the net air pressure generated by the valve during transition to null sound that may occur due to the opening/closing of flap 214. Representatively, in some aspects, when flap 214 opens, it may push some air toward the chamber 802 it is connected to, which may be heard by the user. To avoid this, a second flap 814 that opens in a reverse and/or cancelling arrangement to cancel this air flow from flap 214 may be provided. In this aspect, flap 814 may be connected to a bottom end 816 of support member 304 by hinge 806. Flap 814 may be similar to the previously discussed flap 214 in that it includes a first material layer 814A (e.g., a metal material layer) and a second material layer 814B (e.g., a structural material layer). In addition, similar to support member 302 to which flap 214 is connected to, support member 304 to which flap 814 is connected to may include an insulating layer 308B. Hinge 806 connecting flap 814 to support member 304 may be similar to hinge 306 in that it includes a biasing mechanism or spring 808 to bias flap 814 to the closed position. In this configuration, however, hinge 806 operates in reverse to hinge 306 and allows for the opening/closing of flap 814 in an opposite direction to flap 214. Representatively, upon application of a voltage, hinge 806 allows flap 814 to open in a direction of arrow 810 (toward support member 304) which is opposite to the direction of flap 214 as illustrated by arrow 812 (toward support member 302). In one representative process for cancelling the net air pressure generated by flap 214 during transition to the open configuration of FIG. 8B, when flap 214 is opened, flap 814 is also opened. The flows generated by the opening of both flaps 214, 814 will form a destructive acoustic wave. This, in turn, will reduce the transition sound pressure level (SPL) to a level that is not heard by the user. One exemplary manufacturing process for forming this dual valve configuration would be to form two MEMS wafers with a flap/hinge at one end and then bond them together at opposite ends.

As previously discussed, any one or more of the valve assemblies disclosed herein in reference to FIGS. 1-8B may be dynamically controlled by the application of a voltage to control the amount of leak between the chambers or volumes that they connect. For example, any one or more of the valve assemblies may be dynamically opened to connect a front volume chamber or a back volume chamber of a transducer to an ambient environment surrounding the chambers and/or device enclosure in which the transducer is implemented. In other aspects, any one or more of the valve assemblies may be dynamically opened to connect the front volume chamber to the back volume chamber of the transducer. It should further be understood that although the valve assemblies are described as opening/closing various chamber associated with transducers, they may be used to open/close or otherwise connect any chambers where dynamical control of a leak between the chambers or different volumes is desired.

Figure 9:
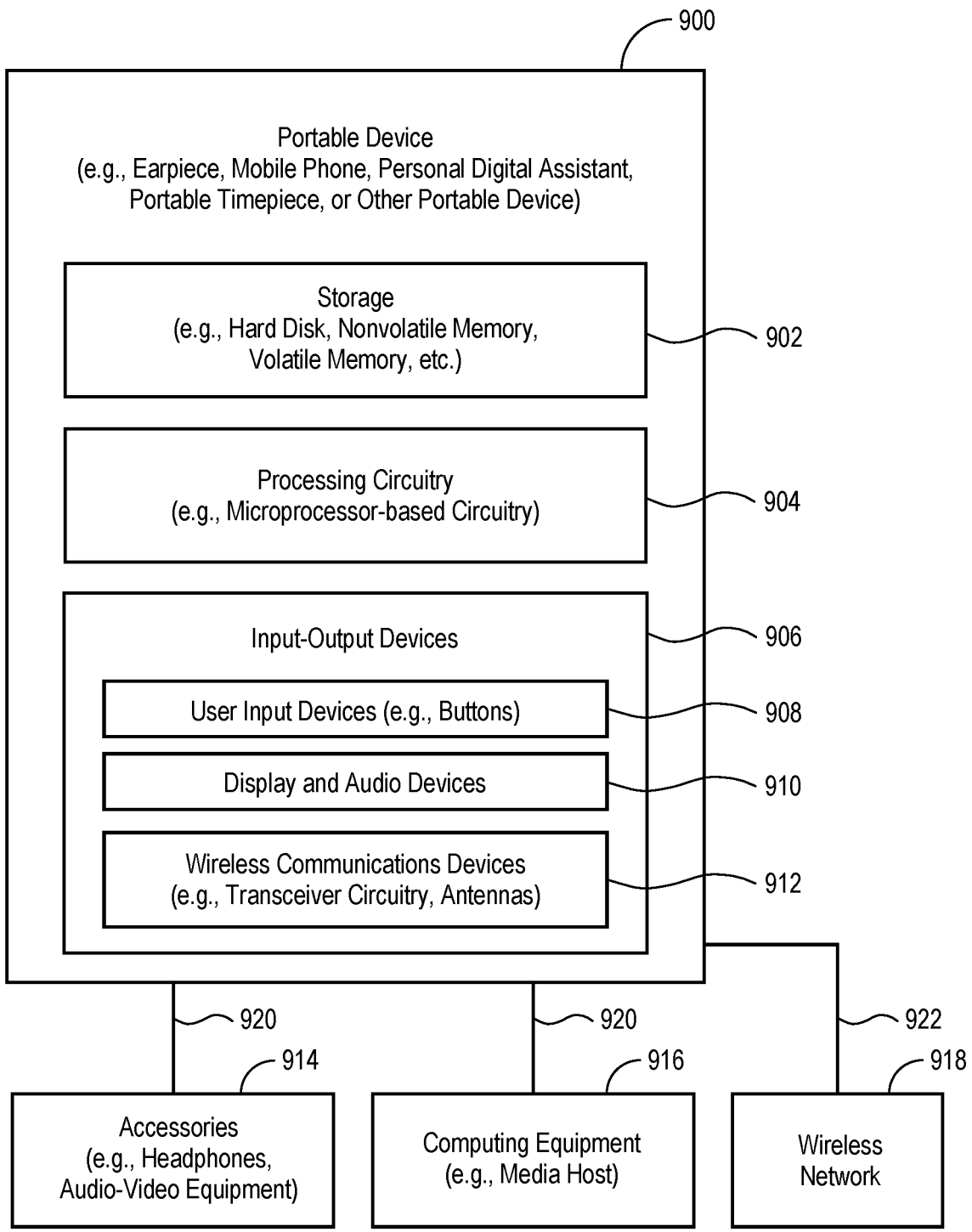
FIG. 9 illustrates a block diagram of one aspect of an electronic device within which a transducer including the valve assembly of FIG. 1-FIG. 8 may be implemented.

FIG. 9 illustrates a block diagram of one aspect of an electronic device within which the previously discussed transducer and/or valve assembly may be implemented. As shown in FIG. 9, device 900 may be any type of portable device within which a transducer and/or valve assembly disclosed herein may be desired, for example, an earpiece (e.g., in-ear earpiece, hearing aid or the like), mobile phone, personal digital assistant, portable timepiece or other portable device. Device 900 may include storage 902. Storage 902 may include one or more different types of storage such as hard disk drive storage, nonvolatile memory (e.g., flash memory or other electrically-programmable-read-only memory), volatile memory (e.g., battery-based static or dynamic random-access-memory), etc.

Processing circuitry 904 may be used to control the operation of device 900. Processing circuitry 904 may be based on a processor such as a microprocessor and other suitable integrated circuits. With one suitable arrangement, processing circuitry 904 and storage 902 are used to run software on device 900, such as internet browsing applications, voice-over-internet-protocol (VOIP) telephone call applications, email applications, media playback applications, operating system functions, etc. Processing circuitry 904 and storage 902 may be used in implementing suitable communications protocols. Communications protocols that may be implemented using processing circuitry 904 and storage 902 include internet protocols, wireless local area network protocols (e.g., IEEE 802.11 protocols—sometimes referred to as Wi-Fi®), protocols for other short-range wireless communications links such as the Bluetooth® protocol, protocols for handling 3G or 4G communications services (e.g., using wide band code division multiple access techniques), 2G cellular telephone communications protocols, etc.

To minimize power consumption, processing circuitry 904 may include power management circuitry to implement power management functions. For example, processing circuitry 904 may be used to adjust the gain settings of amplifiers (e.g., radio-frequency power amplifier circuitry) on device 900. Processing circuitry 904 may also be used to adjust the power supply voltages that are provided to portions of the circuitry on device 900. For example, higher direct-current (DC) power supply voltages may be supplied to active circuits and lower DC power supply voltages may be supplied to circuits that are less active or that are inactive. If desired, processing circuitry 904 may be used to implement a control scheme in which the power amplifier circuitry is adjusted to accommodate transmission power level requests received from a wireless network.

Input-output devices 906 may be used to allow data to be supplied to device 900 and to allow data to be provided from device 900 to external devices. Display screens, microphone acoustic ports, speaker acoustic ports, and docking ports are examples of input-output devices 906. For example, input-output devices 906 can include user input-output devices 906 such as buttons, touch screens, joysticks, click wheels, scrolling wheels, touch pads, key pads, keyboards, microphones, cameras, etc. A user can control the operation of device 900 by supplying commands through user input devices 908. Display and audio devices 910 may include liquid-crystal display (LCD) screens or other screens, light-emitting diodes (LEDs), and other components that present visual information and status data. Display and audio devices 910 may also include audio equipment such as speakers and other devices for creating sound. Display and audio devices 910 may contain audio-video interface equipment such as jacks and other connectors for external headphones and monitors.

Wireless communications devices 912 may include communications circuitry such as radio-frequency (RF) transceiver circuitry formed from one or more integrated circuits, power amplifier circuitry, passive RF components, antennas, and other circuitry for handling RF wireless signals. Wireless signals can also be sent using light (e.g., using infrared communications). Representatively, in the case of a speaker acoustic port, the speaker may be associated with the port and be in communication with an RF antenna for transmission of signals from the far end user to the speaker.

Returning to FIG. 9, device 900 can communicate with external devices such as accessories 914, computing equipment 916, and wireless network 918 as shown by paths 920 and 922. Paths 920 may include wired and wireless paths. Path 922 may be a wireless path. Accessories 914 may include headphones (e.g., a wireless cellular headset or audio headphones) and audio-video equipment (e.g., wireless speakers, a game controller, or other equipment that receives and plays audio and video content), a peripheral such as a wireless printer or camera, etc.

Computing equipment 916 may be any suitable computer. With one suitable arrangement, computing equipment 916 is a computer that has an associated wireless access point (router) or an internal or external wireless card that establishes a wireless connection with device 900. The computer may be a server (e.g., an internet server), a local area network computer with or without internet access, a user's own personal computer, a peer device (e.g., another portable electronic device), or any other suitable computing equipment.

Wireless network 918 may include any suitable network equipment, such as cellular telephone base stations, cellular towers, wireless data networks, computers associated with wireless networks, etc. For example, wireless network 918 may include network management equipment that monitors the wireless signal strength of the wireless handsets (cellular telephones, handheld computing devices, etc.) that are in communication with network 918.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting. For example, although a speaker is specifically disclosed herein, the valve disclosed herein could be used with other types of transducers, for example, microphones. In addition, in some aspects, the valve could be used to open/close the opening to an acoustic resonator or attenuator coupled to a transducer. Still further, although a portable electronic device such as a mobile communications device is described herein, any of the previously discussed valve and transducer configurations may be implemented within a tablet computer, personal computer, laptop computer, notebook computer, headphones and the like. In addition, to aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

What is claimed is:

1. A portable electronic device comprising:
an enclosure having an enclosure wall that forms an interior chamber and a sound output port to an ambient environment;
a transducer positioned within the interior chamber and dividing the interior chamber into a front volume chamber coupling a first side of the transducer to the sound output port and a back volume chamber coupled to a second side of the transducer; and
an electromechanical valve comprising a flap coupled to the enclosure wall by a hinge and operable to rotate about the hinge to open and close a vent to the interior chamber, the front volume chamber or the back volume chamber, and the hinge biases the flap to a closed position, and
wherein the enclosure wall comprises a first width that increases to a second width in a direction away from the hinge to form a sloped surface and reduce a voltage required to transition the flap to an open position in which the flap is coupled to the sloped surface, and
wherein the flap comprises an electrode layer fixedly coupled to a structural material layer and the flap maintains a flat shape when rotating about the hinge to close the vent.

2. The portable electronic device of claim 1 wherein the flap is one of a number of flaps that are operable to open or close the vent to the ambient environment.

3. The portable electronic device of claim 1 wherein the vent comprises a first opening and a second opening, and the flap is a first flap operable to open and close the first opening, and a second flap is operable to open and close the second opening.

4. The portable electronic device of claim 1 wherein the hinge couples the flap to a first portion of the enclosure wall arranged perpendicular to the flap and the flap is perpendicular to the first portion when the vent is closed.

5. The portable electronic device of claim 4 wherein upon application of the voltage, the flap transitions from a closed position to an open position in which it is coupled to the sloped surface by an electrostatic force.

6. The portable electronic device of claim 4 wherein the enclosure wall further comprises a second portion that runs perpendicular to the first portion and is positioned above the flap, and upon application of a voltage, the flap is coupled to the second portion to close the vent.

7. The portable electronic device of claim 4 wherein the flap further comprises a piezoelectric layer coupled to the electrode layer.

8. The portable electronic device of claim 7 wherein the electrode layer is a first electrode layer, and the flap further comprises a second electrode layer coupled to a side of the piezoelectric layer opposite the first electrode layer.

9. The portable electronic device of claim 1 wherein the valve is a first valve, and the device further comprises a second valve having a flap operable to open in an opposite direction to the flap of the first valve to cancel a net air pressure generated by the first valve when transitioning to an open position.

10. A valve assembly for a portable electronic device, the valve assembly comprising:
a support member coupled to an enclosure opening, the support member having an insulating layer; and
an electromechanical flap movably coupled to the support member by a hinge, the electromechanical flap comprising an electrode layer fixedly coupled to a structural material layer, and wherein upon application of a voltage, the electromechanical flap is operable to rotate about the hinge while maintaining a flat shape to transition between a closed configuration in which the electromechanical flap covers the enclosure opening and an open configuration in which the electromechanical flap uncovers the enclosure opening, and the hinge biases the flap to the closed configuration, and
wherein the support member comprises a first width that increases to a second width in a direction away from the hinge to form a sloped surface and reduce a voltage required to transition the flap to the open configuration in which the flap is coupled to the sloped surface.

11. The valve assembly of claim 10 wherein the structural material layer comprises a polysilicon, a silicon nitride, or a single crystalline silicon.

12. The valve assembly of claim 10 wherein the structural material layer comprises a piezoelectric material.

13. The valve assembly of claim 12 further comprising a third material layer, wherein the third material layer comprises a metal.

14. The valve assembly of claim 10 wherein the insulating layer is coupled to the sloped surface, and the flap rotates about the hinge toward the insulating layer to the open configuration.

15. The valve assembly of claim 10 wherein the insulating layer is coupled to a surface of the support member running parallel to the enclosure opening and positioned above the flap, and wherein the flap rotates about the hinge toward the insulating layer to the closed configuration.

16. The valve assembly of claim 10 wherein the electromechanical flap comprises a first electromechanical flap and a second electromechanical flap.

17. The valve assembly of claim 16 wherein the first electromechanical flap and the second electromechanical flap are independently operable to transition between the closed configuration in which the first and second electromechanical flaps cover the enclosure opening and the open configuration in which the first and second electromechanical flaps rotate toward the insulating layer of the support member.

18. The valve assembly of claim 16 wherein the opening comprises a first opening and a second opening, and the first electromechanical flap is operable to transition between the closed configuration in which the first electromechanical flap covers the first opening and the open configuration, and the second electromechanical flap is operable to transition between the closed configuration in which the first electromechanical flap covers the second opening and the open configuration.

19. The valve assembly of claim 16 wherein the support member comprises a first end and a second end opposite the first end, the first electromechanical flap is coupled to the first end, the second electromechanical flap is coupled to the second end, and wherein the second electromechanical flap opens in a direction opposite to the first electromechanical flap to cancel a net air pressure generated by the first electromechanical flap when transitioning to the open configuration.

* * * * *